(12) United States Patent
Gong et al.

(10) Patent No.: US 10,554,152 B2
(45) Date of Patent: Feb. 4, 2020

(54) SELF-POWERED PIEZOELECTRIC ENERGY HARVESTING MICROSYSTEM

(71) Applicant: Texas Instruments Incorporated, Dallas, TX (US)

(72) Inventors: Cuiling Gong, Dallas, TX (US); Jianbai Jenn Wang, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 319 days.

(21) Appl. No.: 15/627,587

(22) Filed: Jun. 20, 2017

(65) Prior Publication Data

US 2017/0288576 A1 Oct. 5, 2017

Related U.S. Application Data

(63) Continuation of application No. 14/325,182, filed on Jul. 7, 2014, now Pat. No. 9,716,446.

(60) Provisional application No. 61/843,225, filed on Jul. 5, 2013.

(51) Int. Cl.

| H01L 41/053 | (2006.01) |
|---|---|
| H01L 41/09 | (2006.01) |
| H02N 2/18 | (2006.01) |
| H02N 2/00 | (2006.01) |
| H01L 27/20 | (2006.01) |
| H01L 41/113 | (2006.01) |
| B81C 1/00 | (2006.01) |

(52) U.S. Cl.
CPC ......... *H02N 2/186* (2013.01); *B81C 1/00246* (2013.01); *H01L 27/20* (2013.01); *H01L 41/113* (2013.01); *H02N 2/181* (2013.01); *H02N 2/22* (2013.01); *B81B 2203/0109* (2013.01); *B81C 2203/075* (2013.01); *Y10T 29/42* (2015.01)

(58) Field of Classification Search
CPC .......... H02N 2/186; H02N 2/181; H02N 2/22; B81C 1/00246; B81C 2203/075; H01L 21/20; H01L 41/113; Y10T 29/42; B81B 2203/0109
USPC .......................................... 310/314–319, 339
See application file for complete search history.

(56) References Cited

U.S. PATENT DOCUMENTS

| 8,604,674 | B2 * | 12/2013 | Fujimoto | ............... | H02N 2/188 |
|---|---|---|---|---|---|
| | | | | | 310/329 |
| 8,680,752 | B2 * | 3/2014 | Ayazi | ..................... | H02N 2/188 |
| | | | | | 310/339 |
| 2006/0098059 | A1 | 5/2006 | Ohguro et al. | | |
| 2007/0228889 | A1 | 10/2007 | Terje et al. | | |

(Continued)

*Primary Examiner* — Thomas M Dougherty
(74) *Attorney, Agent, or Firm* — Michael A. Davis, Jr.; Charles A. Brill; Frank D. Cimino

(57) ABSTRACT

A self-powered piezoelectric energy harvesting microsystem device has CMOS integrated circuit elements, contacts and interconnections formed at a proof mass portion of a die region of a semiconductor wafer. Piezoelectric energy harvesting unit components connected to the integrated circuit elements are formed at a thinned beam portion of the die region that connects the proof mass portion for vibration relative to a surrounding anchor frame portion. A battery provided on the proof mass portion connects to the integrated circuit elements. In a cantilever architectural example, the battery is advantageously located at a distal end of the proof mass portion, opposite the joinder with frame portion via the beam portion.

9 Claims, 8 Drawing Sheets

(56) References Cited

U.S. PATENT DOCUMENTS

| | | |
|---|---|---|
| 2009/0205435 A1 | 8/2009 | Buck et al. |
| 2009/0206703 A1 | 8/2009 | Reichenbach et al. |
| 2009/0211353 A1 | 8/2009 | Gao et al. |
| 2009/0301176 A1 | 12/2009 | Rowe et al. |
| 2013/0162106 A1 | 6/2013 | Yamauchi et al. |
| 2015/0015114 A1 | 1/2015 | Hall et al. |
| 2016/0155927 A1 | 6/2016 | Kabasawa et al. |
| 2016/0190206 A1 | 6/2016 | Tsai et al. |
| 2016/0346556 A1* | 12/2016 | Slepian ............... A61N 1/3785 |

* cited by examiner

SELF-POWERED PIEZOELECTRIC ENERGY HARVESTING MICROSYSTEM

CROSS REFERENCE TO RELATED APPLICATIONS

This application is a continuation of U.S. Nonprovisional patent application Ser. No. 14/325,182, filed Jul. 7, 2014, which claims the benefit of U.S. Provisional Application Ser. No. 61/843,225, filed Jul. 5, 2013, the contents of both of which are herein incorporated by reference in its entirety.

BACKGROUND

In applications of biomedical implants or remote human/ equipment health monitoring, where replacing batteries can be difficult, a self-powered solution relying on harvested energy is highly desirable. Meanwhile, high-quality batteries having low leakage current and thus a long lifetime have to be used, and, in some cases, the battery issue has been one of the main technical challenges. Capability of harvesting energy from the ambient is desired for these applications; however, the existing energy harvesting solutions are mostly based on assembly of discrete components. As a result, they are too big to meet the form factor requirement and energy losses associated with connections of the discrete components largely reduce the efficiency of the system and the energy level that can be harvested.

SUMMARY

A compact self-sustained system suitable for remote sensing and biomedical implantable devices is provided. Using MEMS-CMOS integration and post-processing assembly techniques, this system integrates piezoelectric energy harvester, battery, power management and other functional blocks (such as microprocessor, sensors and their control/ readout circuit, wireless telemetry, etc.) on the same silicon substrate.

In a described example implementation, a self-powered piezoelectric energy harvesting microsystem has integrated circuit elements, including transistor gate structures and source/drain regions formed using CMOS processing steps, located at a proof mass portion of a die region of a semiconductor wafer substrate. Contacts and interconnections for the integrated circuit elements are formed by depositing and patterning dielectric layers and metal layers over the proof mass portion of the die region. Piezoelectric energy harvesting unit components are formed connected to the integrated circuit elements by depositing and patterning first electrode, piezoelectric material and second electrode layers at a beam portion of the die region. A support frame portion of the die region is formed by etching through the substrate to separate it by a gap from a majority of the proof mass portion. One or more beam portions, thinned by partial etching, join a remaining minority of the proof mass portion to the support frame portion. A battery is provided on the proof mass portion connected to the integrated circuit elements. The battery may be provided at a second region of the proof mass laterally spaced from at least a part of a first region at which the integrated circuit elements are provided. In an example cantilever structural configuration, the proof mass is separated by a gap from the support frame along three sides and joined to the support frame by a thinned beam along a fourth side of the proof mass. The battery may be advantageously located adjacent side at the free end, opposite to the fourth side joined to the support frame by the beam.

DETAILED DESCRIPTION OF EXAMPLE EMBODIMENTS

A compact self-sustained system is provided that integrates piezoelectric (PZE) energy harvester, battery, power management (PM) and other functional blocks, such as microprocessor (MCU), sensors and their control/readout circuit, wireless telemetry, etc., on the same silicon substrate.

Figure 1:
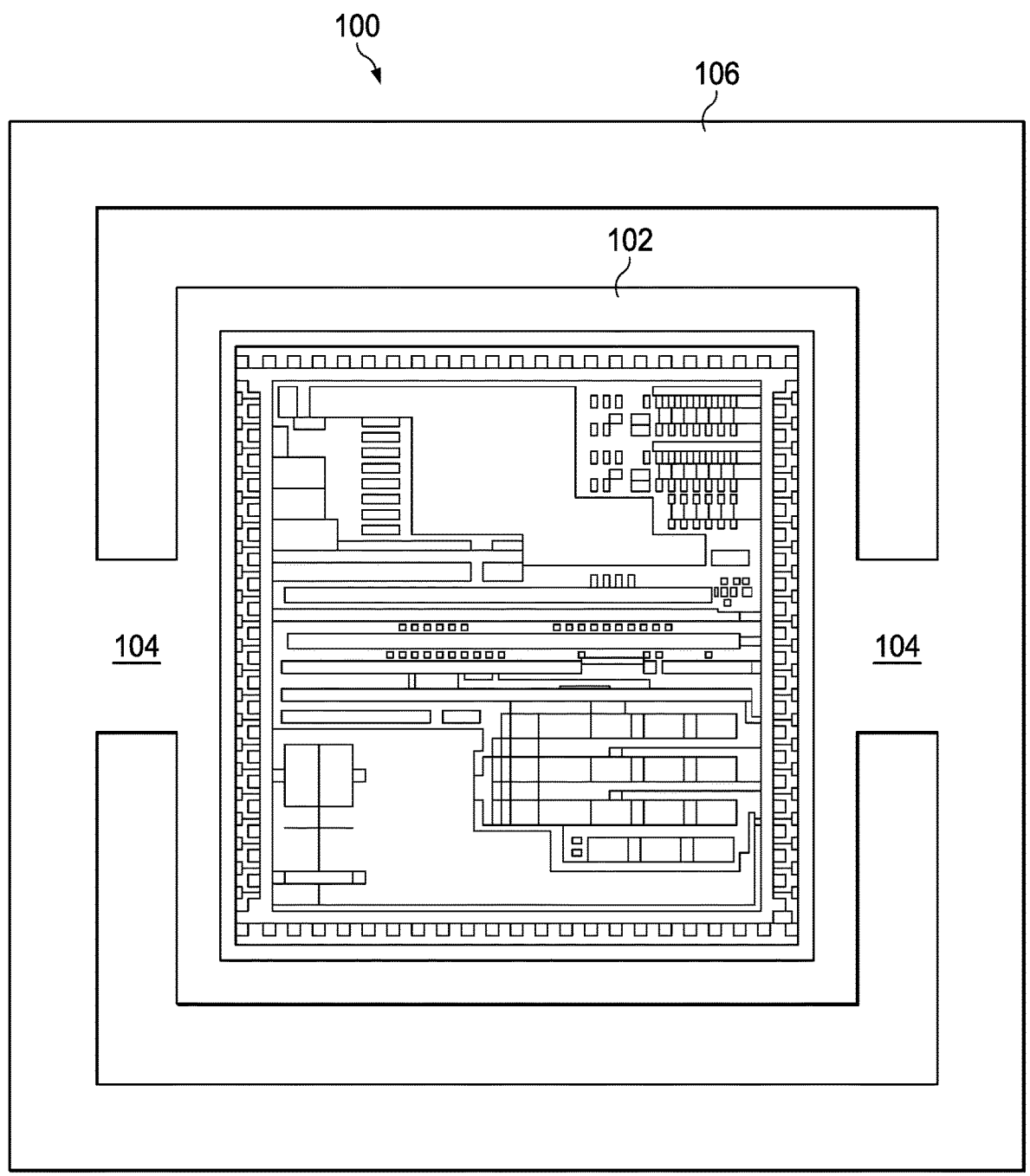
FIG. 1 is a top view of an example energy harvester microsystem showing physical details of the integrated circuitry.
Figure 2:
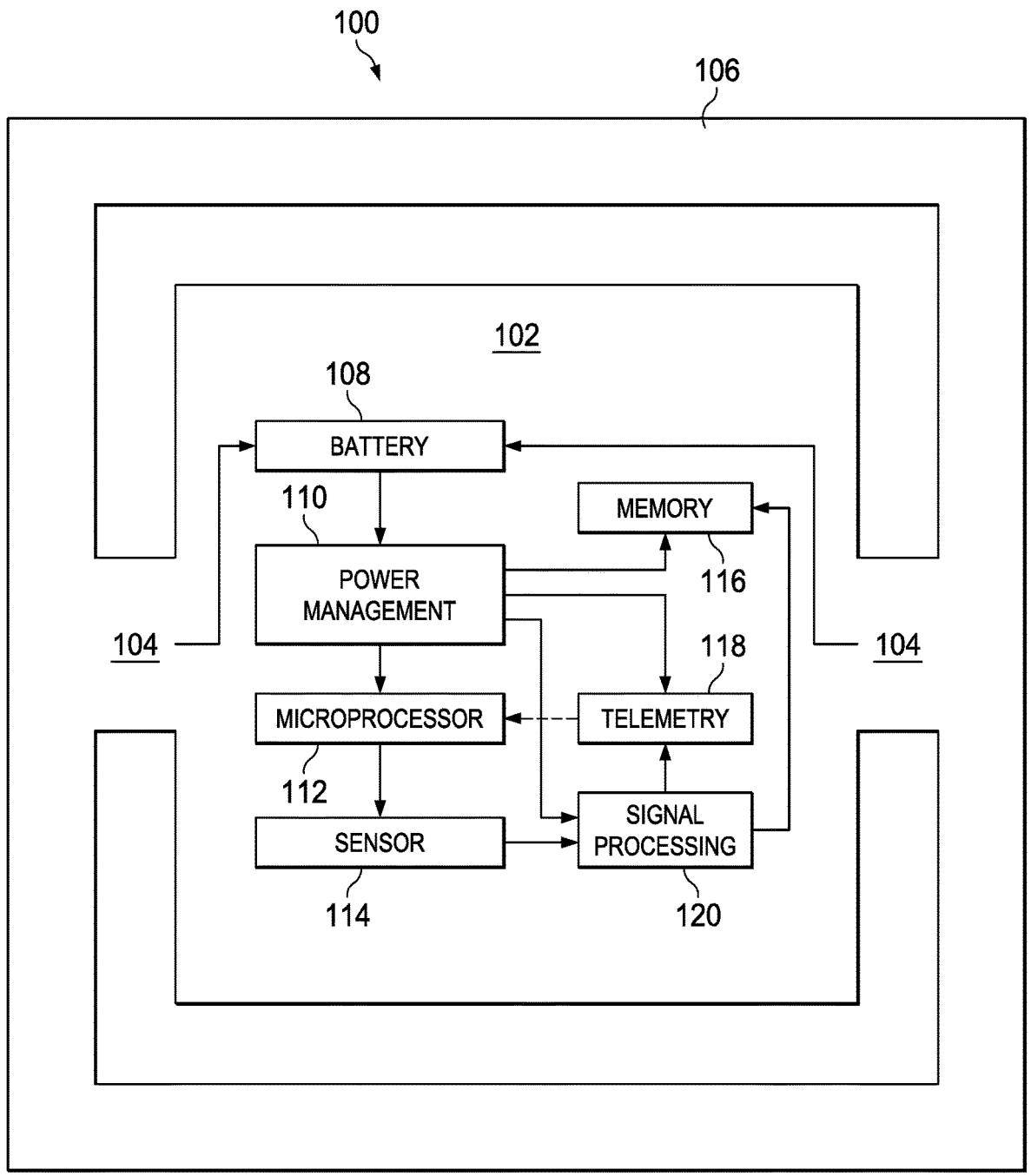
FIG. 2 is a schematic view of the harvester system of FIG. 1 showing the functional blocks.

FIGS. 1 and 2 show an example of a self-sustained system 100 that has all the system components integrated on a proof mass 102 of the harvesters. The harvester 100 shown in FIG. 1 has a beam/hinge structure 104 between the proof mass 102 and stand-off frame structure 106. Other architectures (e.g., cantilever or multi-beam configuration, or combinations of cantilever, beam and multi-beam configurations) may also be used, as shown by the various cantilever, bridge, multiple beam (e.g., orthogonal bridges), and flexible beam (e.g., flexible projections from the proof mass separate from or in addition to structure joining the proof mass to the anchor) architectures illustrated in FIGS. 3A-3E.

The beams shown in FIGS. 1, 2 and 3A-3E have planar rectangular shapes, with one side joining the anchor 106, an opposite side joining the proof mass 102, and the remaining two sides left unattached. Other shapes and contours (e.g., curved, serpentine, etc.) may, however, also be used.

Figure 3A:
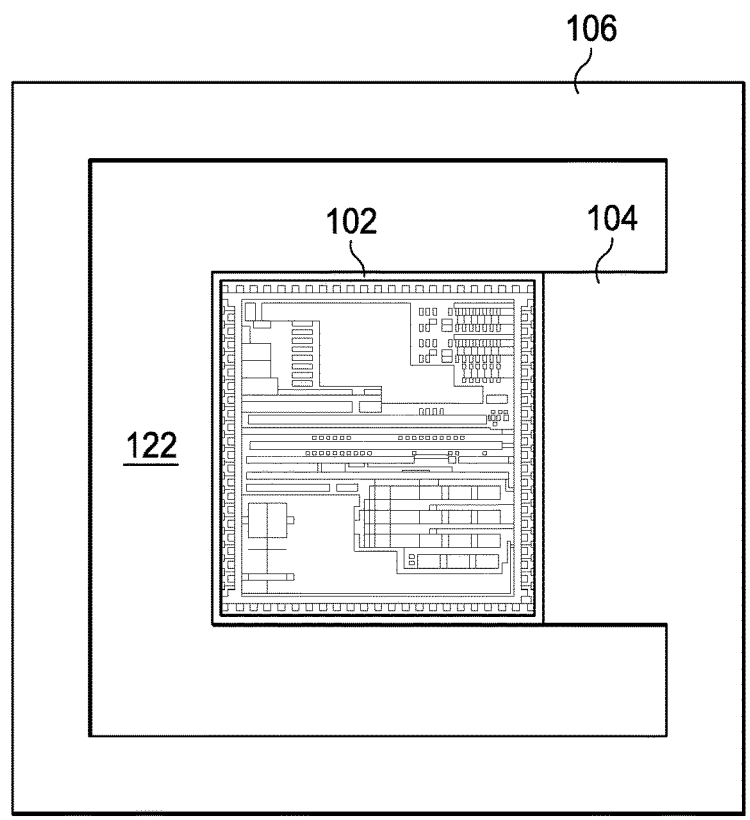
FIGS. 3A-3E illustrate alternative architectures usable for the harvester system shown in FIGS. 1 and 2.
Figure 3B:
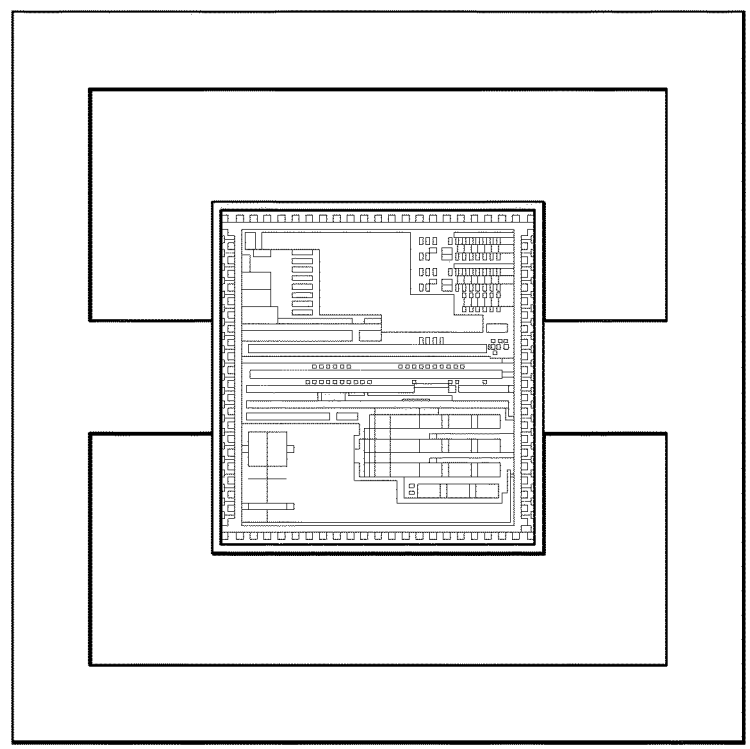
Figure 3C:
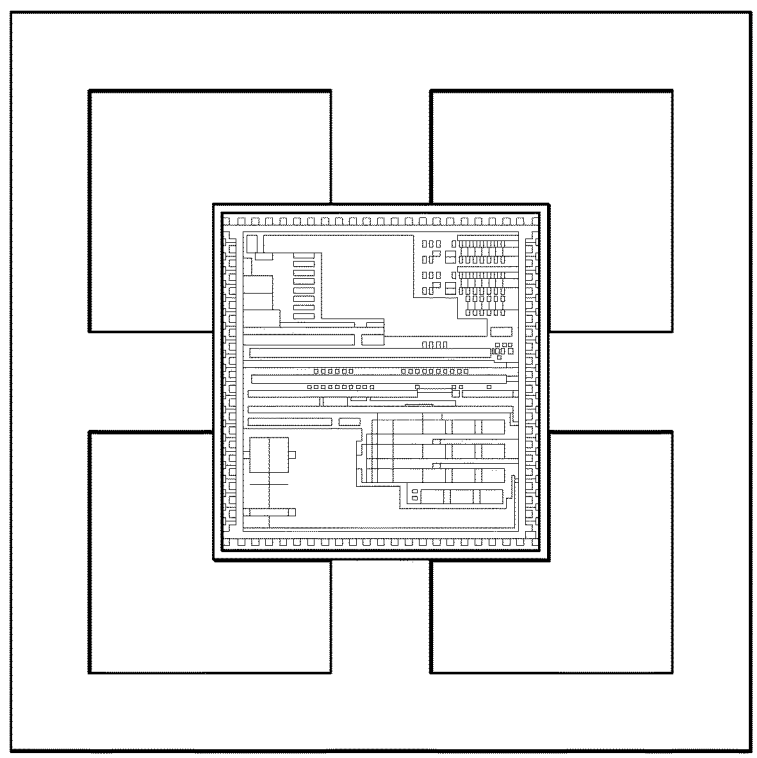
Figure 3D:
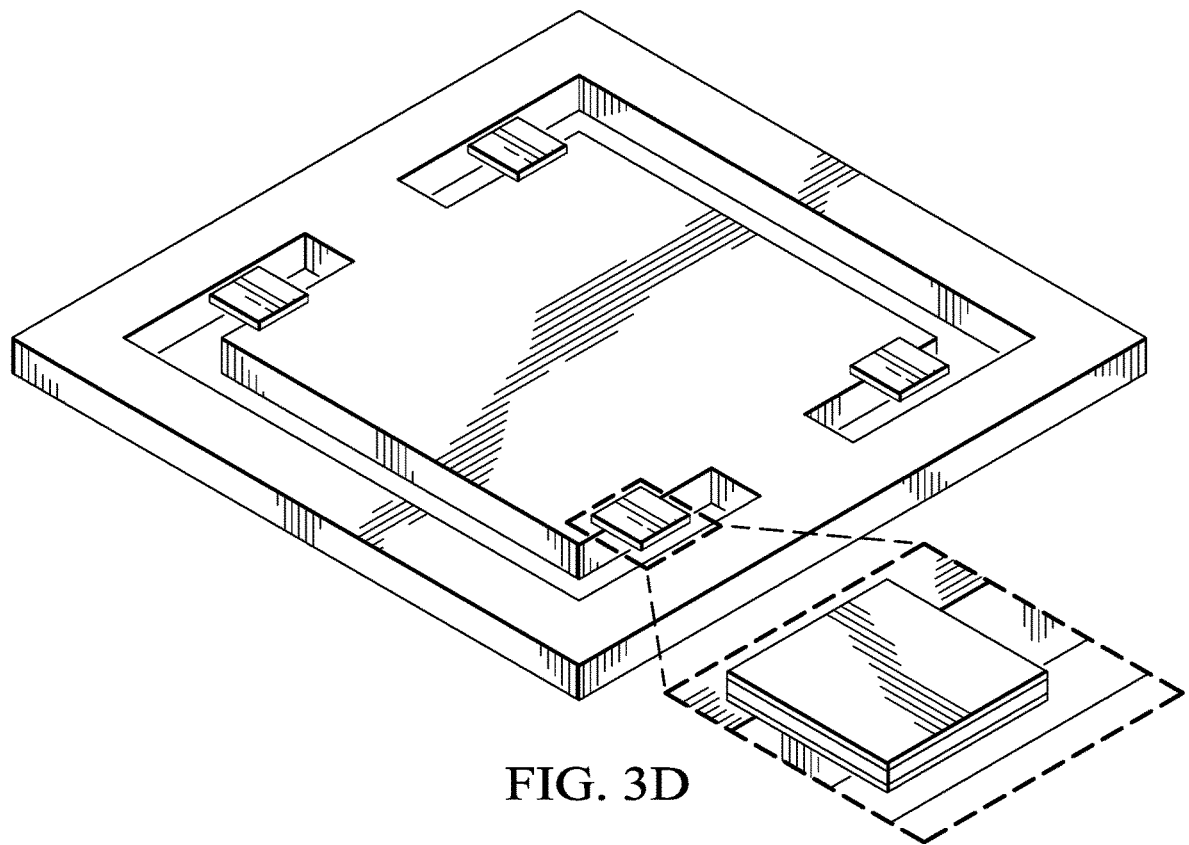
Figure 3E:
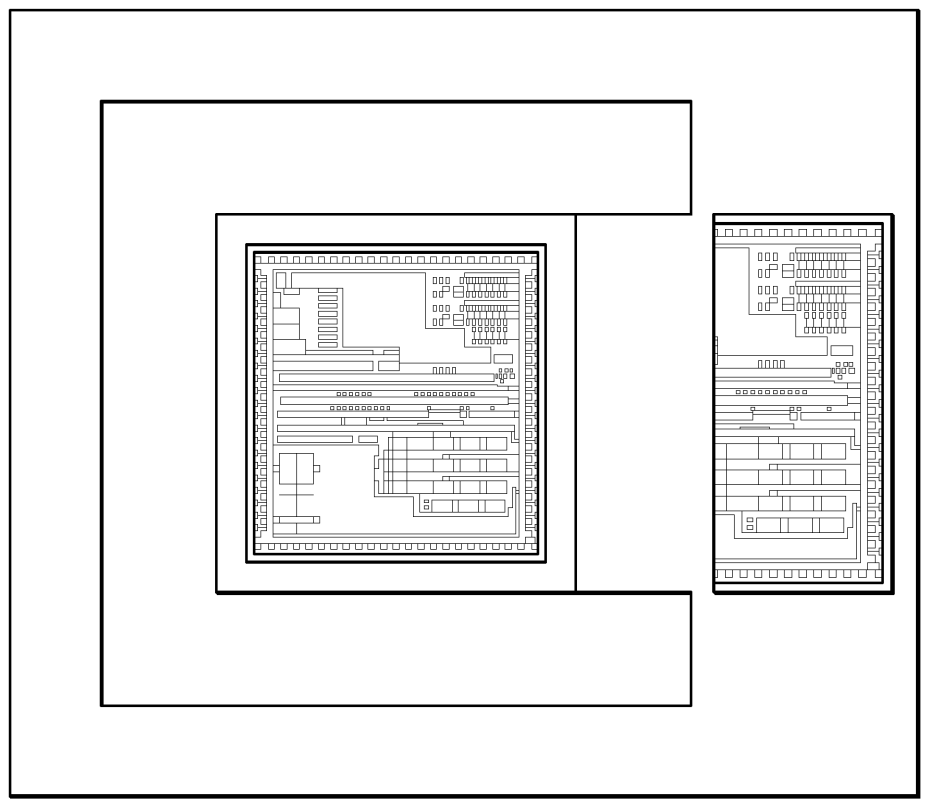

FIGS. 1 and 2 illustrate implementations with battery 108, power management 110 and circuit and sensor elements (e.g., microprocessor 112, sensor 114, memory 116, telemetry 118, signal processing circuit 120) formed integrally with the proof mass 102. FIG. 3E illustrates a modified implementation, wherein the same elements are integrated partially with the proof mass and partially on the stand-off structure anchor.

The piezoelectric elements may be formed as segmented units on the beam, such as shown in application Ser. No. 14/323,996 entitled "Piecewise Piezoelectric Energy Harvester," filed Jul. 3, 2014, incorporated herein by reference. During operation, strain is induced on the piezoelectric material by relative motion of the proof mass 102 relative to the stand-off structure 106. This relative motion can be achieved, for example, by fixing the stand-off frame 106 as an anchor to package supporting structure and leaving the proof mass 102 free to move, or by fixing the proof mass to the package and leaving the stand-off frame free to move. Alternatively, the positions of both the proof mass 102 and the frame 106 can be fixed, and the piezoelectric elements motivated by self-vibration of the flexible beams 106 between the proof mass 102 and the frame 106. The flexible beam substrate underlying the piezoelectric material can be formed using polymeric materials such as parylene.

Conventional approaches locally separate the PZE components of the energy harvesting unit from the battery, power management and other circuit components, integrating at the board level. In the illustrated implementations, those components are integrated on the proof mass and/or stand-off portions of a same single substrate with the PZE elements, thereby fully utilizing silicon area to provide an efficient system. Among the advantages provided by the disclosed approach are: an integrated system solution, compactness or small form factor, lower parasitic losses, and large-scale wafer-level manufacturing and micropackaging processing capability that can potentially lower cost.

Figure 4:
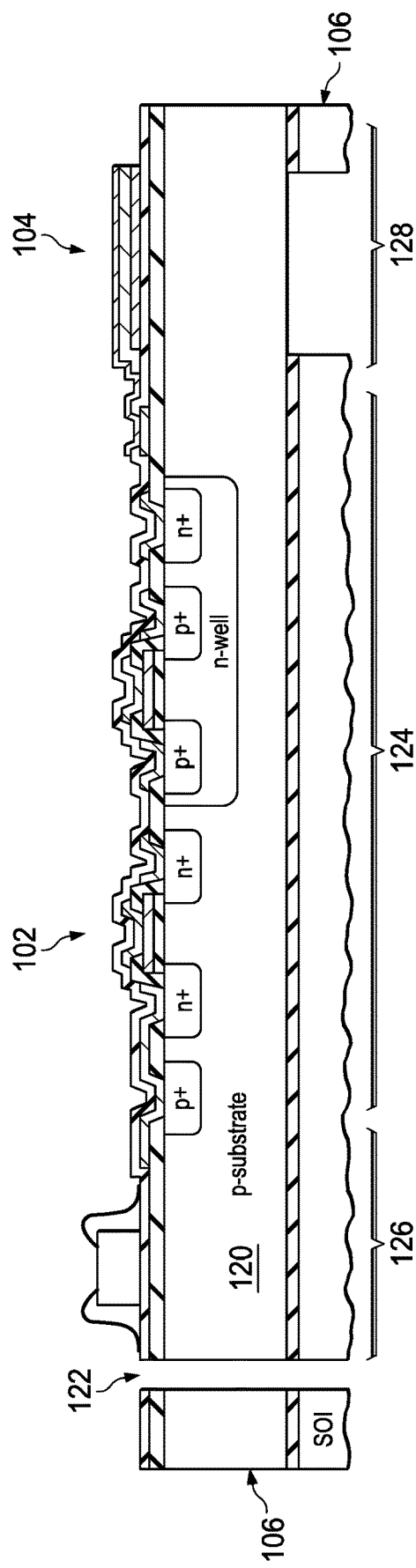
FIG. 4 is a side section view of an example integrated energy harvester microsystem formed on silicon.

FIG. 4 shows an example of the integrated system formed on silicon and FIGS. 5A-5E shows steps in a processes for the manufacture of the integrated device. System integration can be achieved with a combination of a monolithic approach and a hybrid packaging solution.

As shown in FIG. 4, a silicon on insulator (SOI) substrate 120 has a cantilever architecture as shown in FIG. 3 view(a). Substrate 120 is completely etched through to provide an opening 122 separating three sides of a proof mass portion 102 from corresponding three sides of an adjacent marginal stand-off structure 106 and is partially etched through from an underside to provide a reduced thickness beam portion 104 joining a fourth side of the proof mass portion 102 to an adjacent fourth side of the stand-off structure 106. Circuitry components 124 including power management circuitry 110, microprocessor circuitry 112, memory circuitry 116, telemetry circuitry 118 and signal processing circuitry 120 are formed as a CMOS integrated circuit in a first region of the proof mass portion 102. Hybrid components 126 such as a battery 108 and one or more sensor components (e.g., pressure sensor, temperature sensor, etc.) 114 are integrated over a second region of the proof mass portion 102 and connected to the circuitry components 124. Portions of the first and second regions may overlap as appropriate to accommodate connections and for compactness. It may be advantageous for increased vibration sensitivity to position heavier components (viz., battery 108) at the free distal end of the cantilevered proof mass portion 102 (furthest distance from beam 104). Piezoelectric (PZE) harvester components 128 (and optionally additional sensor or other components) are integrated over the beam portion 104, such as described, for example, in application Ser. No. 14/323,996.

The described implementation provides a compact self-sustained system applicable for human/structure/machine health condition monitoring or biomedical implantable devices. Using MEMS-CMOS process integration, the piezoelectric energy harvester components, battery, power management (PM) and other functional blocks (such as microprocessor, sensors and their control/readout circuit, wireless telemetry, etc.) are provided as a system-on-a-chip (SoC) integrated monolithically on a same silicon substrate. For instance, the integrated circuit (IC)(such as PM, microprocessor, signal processing or/and wireless telemetry) can be built first on the silicon substrate, following which the MEMS (micro-electromechanical system) piezoelectric stack and other sensor/actuators may be fabricated. The process ends up with substrate definition using DRIE or silicon etch. The IC and sensor may be located on the proof mass and/or frame anchor region of energy harvester.

Using post-processing assembly techniques, all or some of the non-integrated circuit components can be integrated on the substrate of the energy harvester. The substrate of the energy harvester can be the movable proof mass or the fixed anchoring region. For instance, the battery or sensor/actuator dies which are difficult for monolithic integration can be integrated on the substrate using wire bonding. The substrate can be recessed or flat. Flip-chip bonding can be used as well in some cases. The sensor/actuator to be powered can be integrated in the system. As a result, the system is a closed system with no need for lead transfer.

As a function mode, the sensor can be the harvester itself to detect vibration source abnormality when its performance degrades.

The harvester architecture can have one beam as the cantilevers or multiple beams. The beam structure can vary from straight beam to serpentine structure.

During operation, the strain induced on the piezoelectric material can be achieved by the proof mass motion with the frame fixed in package or by the frame motion with the mass fixed in position.

Both mass and frame can be fixed in position, and self vibration of the flexible beams between them can be utilized. The flexible beam substrate underlying the piezoelectric material can be formed using dielectrics, metal or polymeric materials such as parylene without silicon.

FIGS. 5A-5E illustrate steps in formation of an example device like that of FIG. 4. A silicon-on-insulator die region of a wafer comprises a layer of silicon 502 epitaxially formed over an insulator layer 504 formed on a semiconductor wafer material 506. The silicon layer 502 may be background p-type doped material. The wafer may have multiple die regions, each of which may be simultaneously similarly processed to form corresponding multiple like instances of the example device.

Figure 5A:
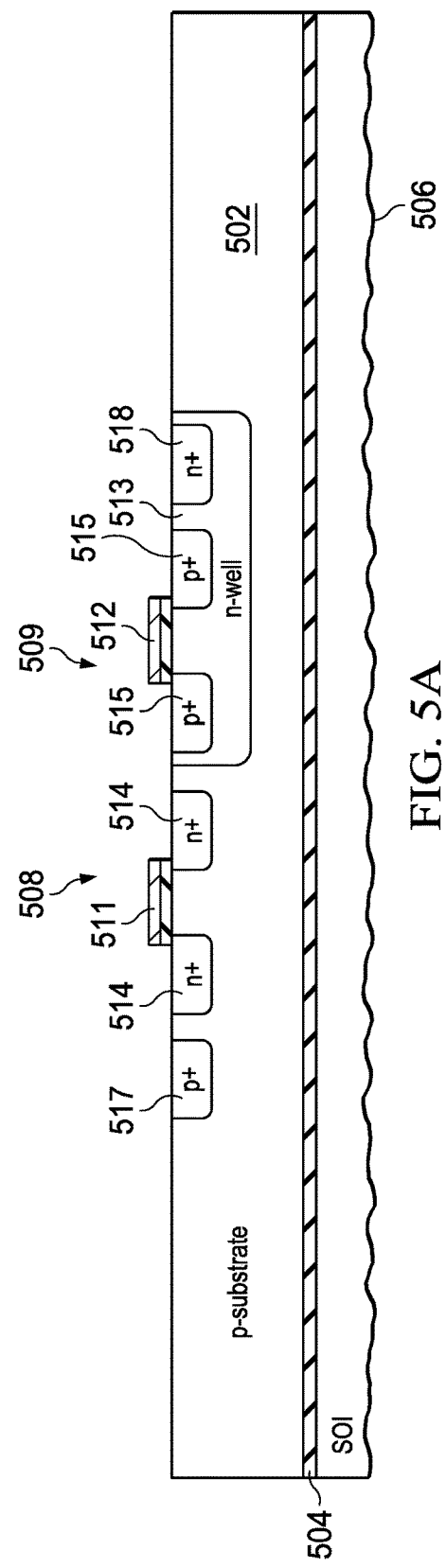
FIGS. 5A-5E show steps in a process for the manufacture of the integrated device of FIG. 4.

Integrated circuit elements are formed on the SOI substrate using CMOS processing steps. FIG. 5A shows the formation of NMOS and PMOS transistors 508, 509. Transistor gates 511, 512 comprising gate electrode material over gate dielectric material are formed over an NMOS transistor region in the p-type substrate and over an n-well 513 formed in a PMOS transistor region of the p-type substrate. Source/drain regions 514, 515 are formed on sides of the gates 511, 512 by n-type dopant implantation in the NMOS transistor region and by p-type dopant implantation in the n-well 513 in the PMOS transistor region. Body contact regions 517, 518 are formed spaced from a source/drain region 514 by p-type dopant implantation in the NMOS transistor region and spaced from a source/drain region 515 by n-type dopant implantation in the n-well 513 in the PMOS transistor region.

Figure 5B:
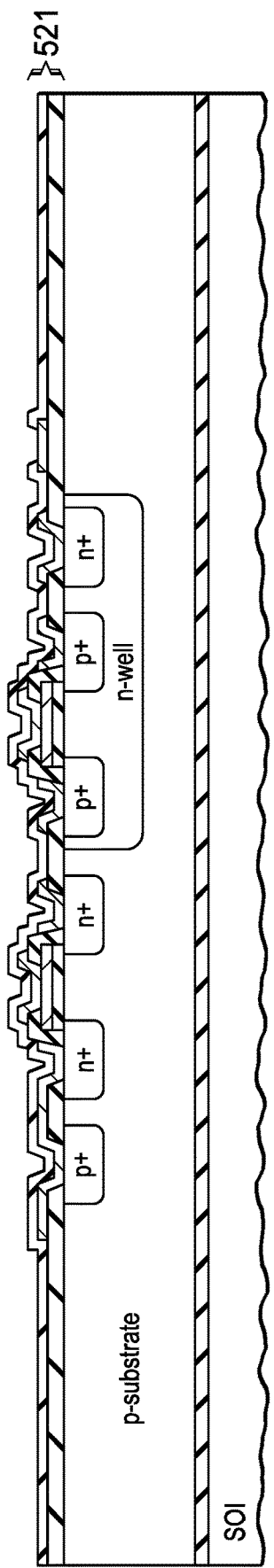

Next, as shown in FIG. 5B, interconnections 521 including dielectric (pre-metal and interlevel dielectric) layers and metal (contacts, via and trench interconnect) layers are formed and patterned over the doped substrate and gate structures to provide connections between the regions of the transistors 508, 509 and other parts of the CMOS circuitry.

Figure 5C:
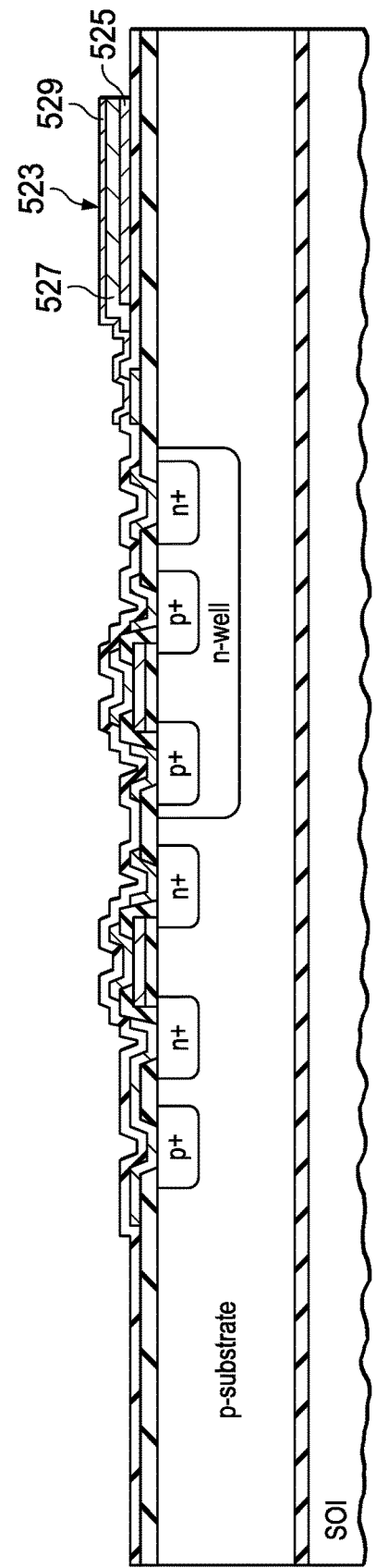

Next, as shown in FIG. 5C, piezoelectric energy harvesting unit components 523 are applied over the substrate. In the illustrated process, a first contact (lower electrode) 525 is formed (such as by selective deposition of a first electrode material through a patterned mask) over a region of a first interlevel dielectric layer at a location laterally removed (to the right of) the NMOS and PMOS transistors. Thereafter, a piezoelectric material 527 is formed (such as by selective deposition of a piezoelectric material through a patterned mask) over the first electrode 525, and a second contact (upper electrode) 529 is formed (in similar way) over the piezoelectric material 527. Multiple piezoelectric energy harvesting unit components 523 may be formed in configurations as described in application Ser. No. 14/323,996.

Figure 5D:
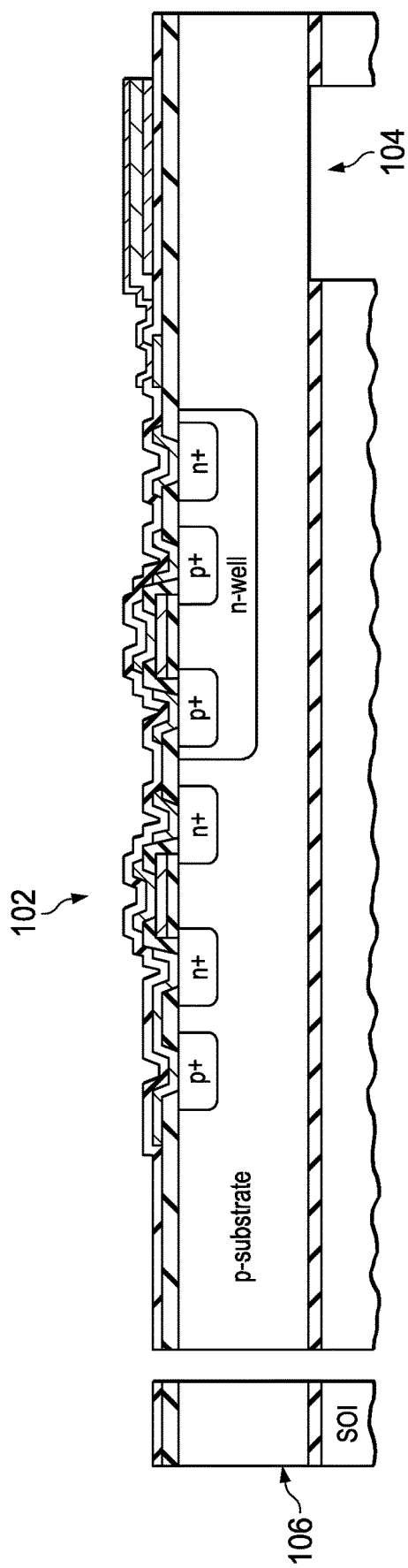

Next, as shown in FIG. 5D, the mechanical structure is patterned to define proof mass 102, beam 104 and frame 106 portions of the device. For formation of a cantilever structure such as shown in view (a) of FIG. 3, a U-shaped channel 122 (see FIG. 3 view (a)) is etched through the substrate to define three sides of the proof mass portion 102 of the device, separated by spaces from surrounding parts of the frame portion 106. The left side of FIG. 5C shows the wafer die region being etched through at the leading side (distal free end) of the proof mass region 102 (leftmost side in view (a) of FIG. 3). For formation of the beam portion 104, the wafer is etched partially through from the back of the substrate, providing a thinned connecting portion below the formed piezoelectric elements 523, extending from the frame portion 106 to the proof mass portion 102.

Figure 5E:
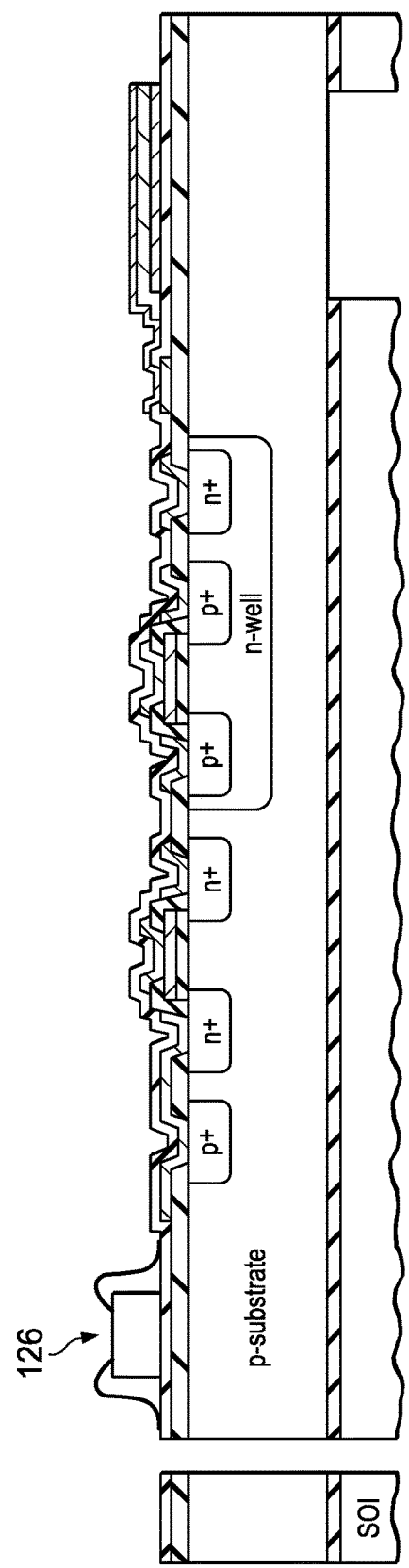

Finally, as illustrated in FIG. 5E, battery, sensor and similar components 126 not formed with the rest of the circuitry in the prior CMOS processing steps are added elsewhere on the proof mass portion 102 (and/or frame portion 106) of the substrate. One or more protective layers may then be formed over the substrate over the hybrid integrated system and final back-end-of line or other subsequent processing accomplished to complete the device. Singulation of the individual die structures from a composite wafer may be done as a final step or after any convenient prior step in the processing.

Those skilled in the art will appreciate that modifications may be made to the described embodiments, and also that many other embodiments are possible, within the scope of the invention.

What is claimed is:

1. A self-powered piezoelectric energy harvesting microsystem device, comprising:
   integrated circuit elements located at a central portion of a die region of a semiconductor wafer substrate;
   contacts and interconnections for the integrated circuit elements formed by metal layers over the central portion of the die region;
   piezoelectric energy harvesting unit components connected to the integrated circuit elements formed by first electrode, piezoelectric material and second electrode layers at a beam portion of the die region; and
   a battery provided on the central portion connected to the integrated circuit elements;
   wherein the die region includes a gap between a support frame portion and the central portion at least partially along at least 2 sides of the central portion and the beam portion has a thickness less than the central and support frame portions and joins a minority of the central portion to the support frame portion.

2. The device of claim 1, wherein the integrated circuit elements are provided at a first region of the central portion; and the battery is provided at a second region of the central portion laterally spaced from the first region.

3. The device of claim 2, wherein the device has a cantilever structural configuration with the central portion separated by a gap from the support frame portion along three sides of the central portion, and the beam portion joining the central portion to the support frame portion along a fourth side of the central portion.

4. The device of claim 3, wherein the battery is located adjacent a side of the central portion which is opposite to the fourth side of the central portion.

5. The device of claim 4, wherein the die region is a singulated die region defining a die.

6. The method of claim 1, wherein the beam portion includes a first beam portion between the central portion and the support frame portion on a first side of the central portion and a second beam portion between the central portion and the support frame portion on a second side of the central portion opposite the first side.

7. The method of claim 6, wherein the beam portion further comprises a third beam between the central portion and the support frame portion on a third side of the central portion and a fourth beam portion between the central portion and the support frame portion on a fourth side of the central portion opposite the third side.

8. The method of claim 1, wherein the support frame portion is separated by the gap along first and second sides of the central portion and joined by the beam portion along third and fourth sides of the central portion.

9. A self-powered piezoelectric energy harvesting microsystem device, comprising:
   integrated circuit elements located at a central portion of a die region of a semiconductor wafer substrate;
   contacts and interconnections for the integrated circuit elements formed by metal layers over the central portion of the die region;
   piezoelectric energy harvesting unit components connected to the integrated circuit elements, the piezoelectric energy harvesting unit comprising a first electrode, a piezoelectric material layer, and a second electrode at a beam portion of the die region; and
   a battery provided on the central portion connected to the integrated circuit elements; wherein:
      the die region includes a gap between a support frame portion and the central portion along first, second, and third sides of the central portion;
      the beam portion has a thickness less than the central and support frame portions and joins the central portion to the support frame portion on a fourth side of the central portion; and
      integrated circuit elements are provided at a first region of the central portion; and the battery is provided at a second region of the central portion laterally spaced from the first region.

* * * * *